(12) United States Patent  (10) Patent No.: US 9,076,991 B2
Kurita et al.  (45) Date of Patent: Jul. 7, 2015

(54) MASK MANAGEMENT SYSTEM AND METHOD FOR OLED ENCAPSULATION

(75) Inventors: Shinichi Kurita, San Jose, CA (US); Beom Soo Kim, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/126,211

(22) PCT Filed: Jun. 18, 2012

(86) PCT No.: PCT/US2012/042988
§ 371 (c)(1),
(2), (4) Date: Feb. 25, 2014

(87) PCT Pub. No.: WO2012/174550
PCT Pub. Date: Dec. 20, 2012

(65) Prior Publication Data
US 2014/0170785 A1    Jun. 19, 2014

Related U.S. Application Data

(63) Continuation-in-part of application No. PCT/US2012/033657, filed on Apr. 13, 2012.

(60) Provisional application No. 61/599,343, filed on Feb. 15, 2012, provisional application No. 61/498,523, filed on Jun. 17, 2011.

(51) Int. Cl.
*H01L 21/00* (2006.01)
*H01L 51/56* (2006.01)
*C23C 16/04* (2006.01)

(52) U.S. Cl.
CPC .............. *H01L 51/56* (2013.01); *C23C 16/042* (2013.01)

(58) Field of Classification Search
USPC .......................................................... 438/26
See application file for complete search history.

(56) References Cited

U.S. PATENT DOCUMENTS 6,949,389 B2   9/2005   Pichler et al.
7,504,332 B2   3/2009   Won et al.
(Continued)

FOREIGN PATENT DOCUMENTS

JP    2006-206980 A    8/2006
KR    2006-0114462 A    11/2006
(Continued)

OTHER PUBLICATIONS

International Search Report and Written Opinion dated Oct. 30, 2012 for PCT/US2012/033657.
International Search Report and Written Opinion dated Jan. 7, 2013 for PCT/US2012/042988.

*Primary Examiner* — Asok K Sarkar
(74) *Attorney, Agent, or Firm* — Patterson & Sheridan, LLP

(57) ABSTRACT

A system and method for encapsulating an organic light-emitting diode (OLED) device by enabling a substrate and a plurality of masks to be efficiently received into a vacuum processing environment, transferred between one or more process chambers for the deposition of encapsulating layers, and removed from the processing system. A method of encapsulating an organic light-emitting diode (OLED) device includes positioning one or more masks over a substrate to deposit encapsulating layers on an OLED device disposed on the substrate. A processing system for encapsulating an organic light-emitting diode (OLED) device includes one or more transfer chambers, one or more load lock chambers coupled to each transfer chamber and operable to receive a mask into a vacuum environment, and one or more process chambers coupled to each transfer chamber and operable to deposit an encapsulating layer on a substrate.

20 Claims, 13 Drawing Sheets

(56) References Cited

U.S. PATENT DOCUMENTS

2005/0239294 A1 10/2005 Rosenblum et al.
2011/0132260 A1 6/2011 Yamazaki et al.
2011/0140163 A1 6/2011 Oh et al.

FOREIGN PATENT DOCUMENTS

KR 2006-0131276 A 12/2006
KR 2009-0108887 A 10/2009

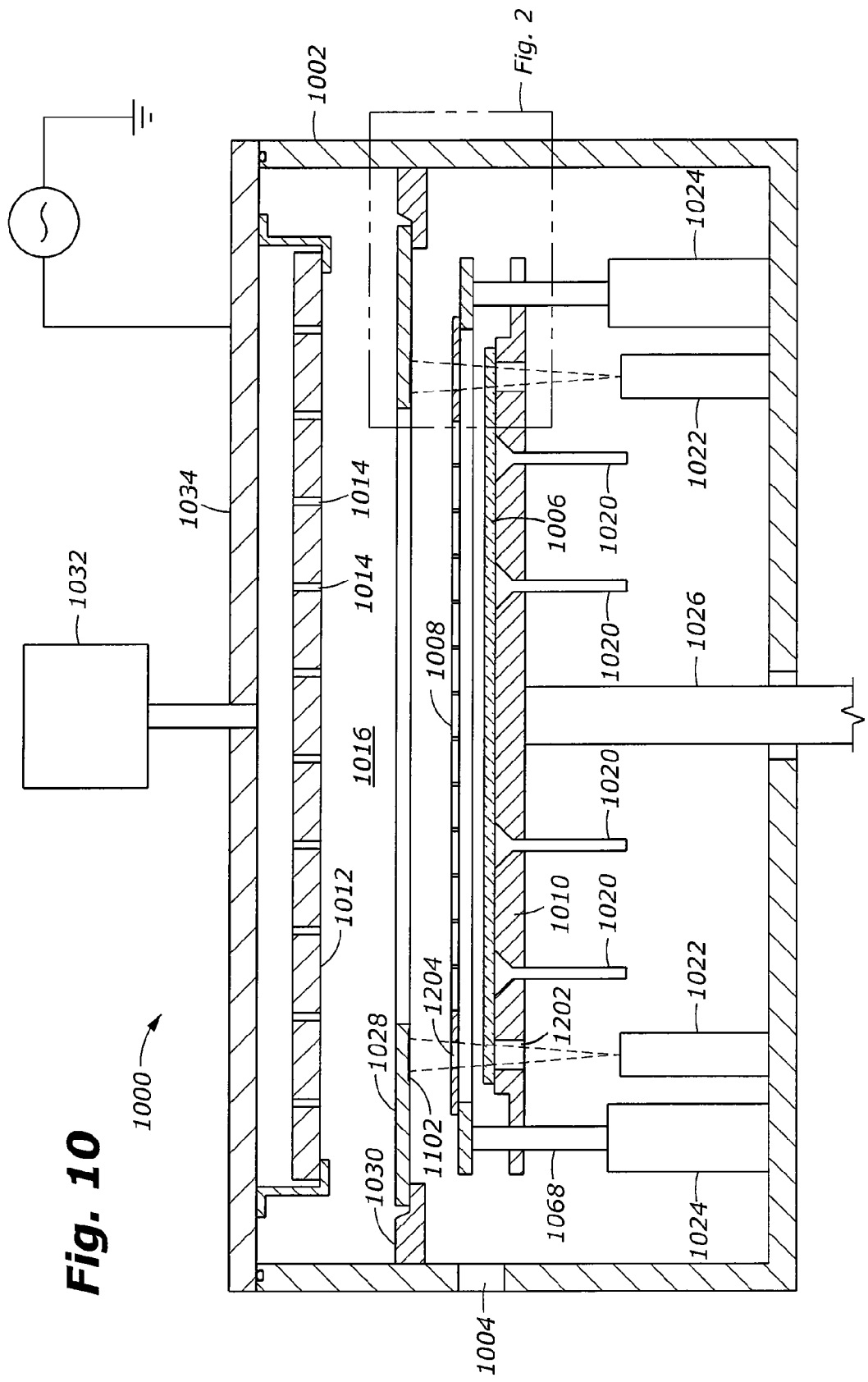

MASK MANAGEMENT SYSTEM AND METHOD FOR OLED ENCAPSULATION

BACKGROUND

1. Field of the Invention

Embodiments of the invention relate to a system and method for encapsulating an organic light-emitting device formed on a substrate.

2. Description of the Related Art

Organic light emitting diodes (OLEDs) are used in the manufacture of television screens, computer monitors, mobile phones, other hand-held devices, etc. for displaying information. A typical OLED may include layers of organic material situated between two electrodes that are all deposited on a substrate in a manner to form a matrix display panel having individually energizable pixels. The OLED is generally placed between two glass panels, and the edges of the glass panels are sealed to encapsulate the OLED therein.

There are many challenges encountered in the manufacture of such display devices. In one example, there are numerous labor intensive steps necessary to encapsulate the OLED between the two glass panels to prevent possible contamination of the device. In another example, different sizes of display screens and thus glass panels may require substantial reconfiguration of the process and process hardware used to form the display devices.

Therefore, there is a continuous need for new and improved apparatus and methods for forming OLED display devices.

SUMMARY

In one embodiment, a method of encapsulating an organic light-emitting diode (OLED) device includes positioning a first mask over a substrate, the first mask having a first size, and depositing a first encapsulating layer on an OLED device disposed on the substrate with the first mask. The method further includes positioning a second mask over the substrate, the second mask having a second size, and depositing a buffer layer on the first encapsulating layer and the OLED device with the second mask. The method further includes positioning a third mask over the substrate, the third mask having a size equal to the first size, and depositing a second encapsulating layer on the buffer layer, the first encapsulating layer, and the OLED device with the first mask.

In another embodiment, a method for encapsulating an organic light-emitting diode (OLED) device in a processing system includes receiving a substrate and a first mask into a first transfer chamber, positioning the first mask over the substrate in a first process chamber, and depositing a first encapsulating layer on an OLED device disposed on the substrate in the first process chamber. The method further includes receiving the substrate and a second mask into a second transfer chamber, positioning the second mask over the substrate in a second process chamber, and depositing a buffer layer on the first encapsulating layer and the OLED device in the second process chamber. The method further includes receiving the substrate and a third mask into a third transfer chamber, the third mask having substantially the same mask pattern as the first mask, positioning the third mask over the substrate in a third process chamber, and depositing a second encapsulating layer on the buffer layer, the first encapsulating layer, and the OLED device in the third process chamber.

In yet another embodiment, a processing system for encapsulating an organic light-emitting diode (OLED) device includes a first transfer chamber, a first load lock chamber coupled to the first transfer chamber and operable to receive one or more first masks into a vacuum environment, and a first process chamber coupled to the first transfer chamber and operable to deposit a first encapsulating layer on a substrate. The processing system further includes a second transfer chamber in transferable communication with the first transfer chamber, a second load lock chamber coupled to the second transfer chamber and operable to receive one or more second masks into a vacuum environment, and a second process chamber coupled to the second transfer chamber and operable to deposit a buffer layer on the substrate. The processing system further includes a third transfer chamber in transferable communication with the second transfer chamber, a third load lock chamber coupled to the third transfer chamber and operable to receive one or more third masks into a vacuum environment, and a third process chamber coupled to the third transfer chamber and operable to deposit a second encapsulating layer on the substrate.

BRIEF DESCRIPTION OF THE DRAWINGS

So that the manner in which the above recited features can be understood in detail, a more particular description of embodiments of the invention, briefly summarized above, may be had by reference to the embodiments, some of which are illustrated in the appended drawings. It is to be noted, however, that the appended drawings illustrate only typical embodiments and are therefore not to be considered limiting of its scope, for the invention may admit to other equally effective embodiments.

FIG. 10 is a schematic cross-sectional view of a CVD apparatus according to one embodiment.

DETAILED DESCRIPTION

Embodiments of the invention include a system and method for encapsulating an OLED device formed on a substrate. The methods and chamber configurations described herein enable a substrate and a plurality of masks to be efficiently received into a vacuum processing environment, transferred between one or more process chambers for the deposition of encapsulating layers, and removed from the processing system. Although various embodiments are described as being performed with particular types of process chambers and deposition processes, such embodiments may also be utilize other types of process chambers and deposition processes and are not limited to the exemplary process chambers and deposition processes described herein. The embodiments described herein may also be used with various types, shapes, and sizes of masks and substrates.

Figure 1:
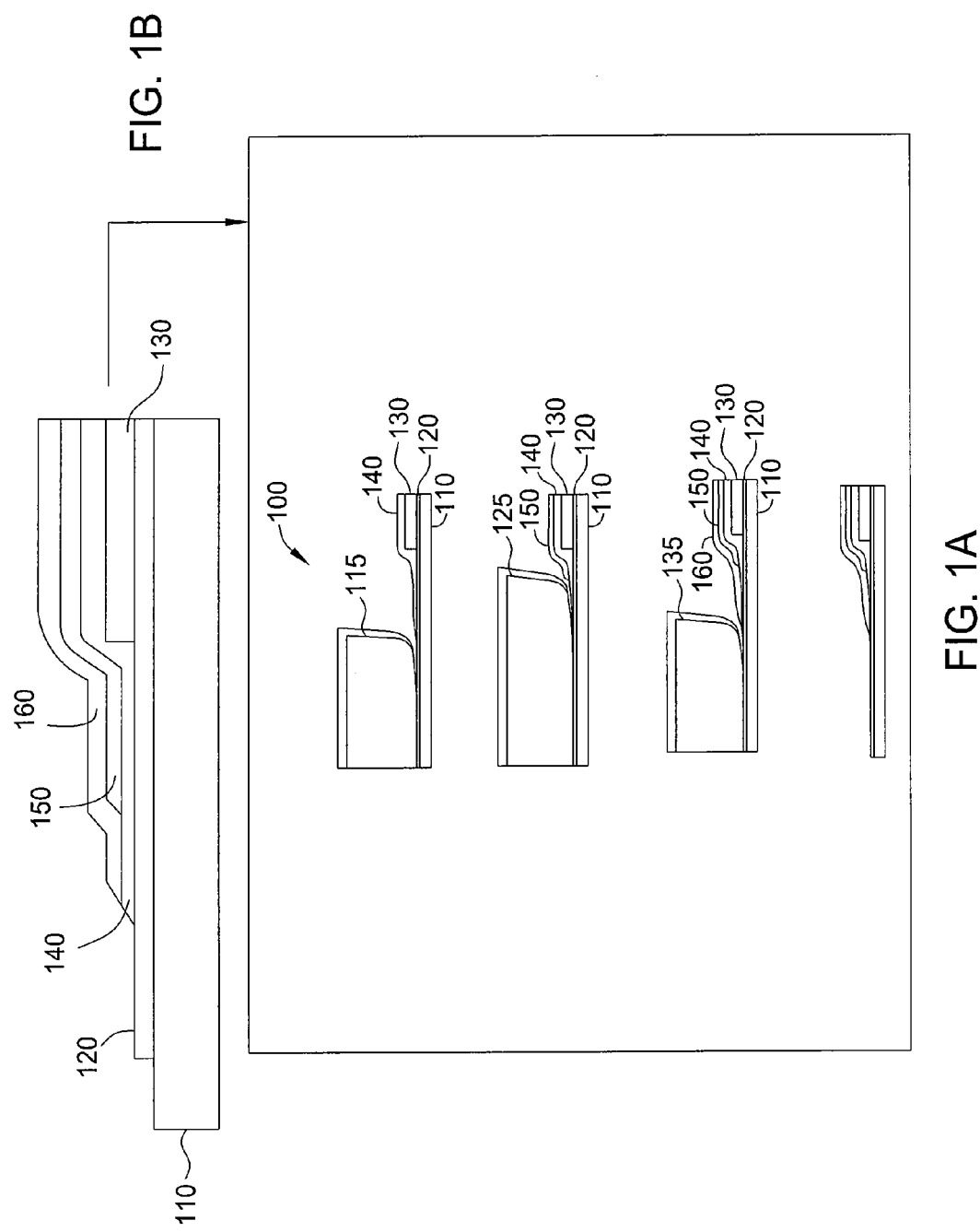
FIGS. 1A and 1B illustrate processes for encapsulating an OLED device.

FIGS. 1A and 1B illustrate a process for encapsulating an OLED device. As illustrated, an OLED 130 may be deposited on a substrate 110 and encapsulated with one or more layers comprising silicon nitride (SiN), aluminum oxide ($Al_2O_3$), and/or a carbon-containing layer, such as a polymer. A contact layer 120 may be formed between the OLED 130 and the substrate 110. During layer deposition and patterning processes, one or more masks may be used to cover portions of the contact layer 120 on the substrate 110. By masking portions of the contact layer 120, an electrical connection may be established with the encapsulated OLED 130 without cutting through the encapsulation layer(s), which may expose the OLED 130 to harmful moisture.

FIG. 1A illustrates a process 100 for encapsulating an OLED device. In the process 100, a first mask 115 having a first size is positioned on the substrate 110 and/or the contact layer 120. The substrate 110 and the first mask 115 are positioned in a process chamber for depositing a first layer 140 on the OLED 130. The first layer 140 may be, for example, a silicon nitride layer deposited using a chemical vapor deposition (CVD) process or an aluminum oxide layer deposited using a physical vapor deposition (PVD) process. The first mask 115 is then removed from the surface of the substrate 110, and a second mask 125 having a second size is positioned on the substrate 110 to mask a portion of the first layer 140, the contact layer 120, and/or the substrate 110. The substrate 110 and the second mask 125 are positioned in a second process chamber for depositing a second layer 150 on the first layer 140 and the OLED 130. The second layer 150 may be a carbon-containing layer, such as a polymer layer deposited using a monomer evaporation process, and may function as a buffer layer to cushion the layers deposited on the OLED 130. The second mask 125 is then removed from the surface of the substrate 110, and a third mask 135 having a size equal to (or substantially equal to) the first size is positioned on the substrate 110 and/or the contact layer 120. The substrate 110 and the third mask 135 are then positioned in a third process chamber for depositing a third layer 160 on the second layer 150, the first layer 140, and the OLED 130. The third layer 160 may be, for example, a silicon nitride layer deposited using a CVD process or an aluminum oxide layer deposited using a PVD process.

The mask 115 used to form the first layer 140 may be the same mask as the mask 135 used to form the third layer 160, or the mask 115 used to form the first layer 140 may be a different mask having the same (or substantially the same) pattern as the mask 135 used to form the third layer 160. Optionally, the first and third layers 140, 160 may be deposited in the same process chamber. For example, a first layer 140 comprising SiN may be deposited in the process chamber, and a third layer 160 comprising SiN may deposited in the process chamber.

In various embodiments, the substrate may have a width of about 1300 millimeters (mm), a height of about 1500 mm, and a thickness of about 0.4-0.5 mm. The substrate may be formed from a glass material or a similar material having a low coefficient of thermal expansion. The OLED may be encapsulated with multiple layers, such as 3-5 layers or more, with each layer being deposited at a temperature of about 80° C. to about 100° C. The thickness of the encapsulating layers may be about 500 nanometers (nm). The thickness of the buffer layer(s) may be about 1 nm to about 2 nm. The masks 115, 125, 135 may have a width of about 1500 mm, a height of about 1700 mm, a thickness of about 0.1 mm, and a frame thickness of greater than about 0.7 mm. The mask material may be formed from a material having a low coefficient of thermal expansion, such as Invar. Alignment of the masks 115, 125, 135 with the substrate may be performed within each process chamber or may be performed prior to positioning the masks and substrate in the process chambers.

Figure 2:
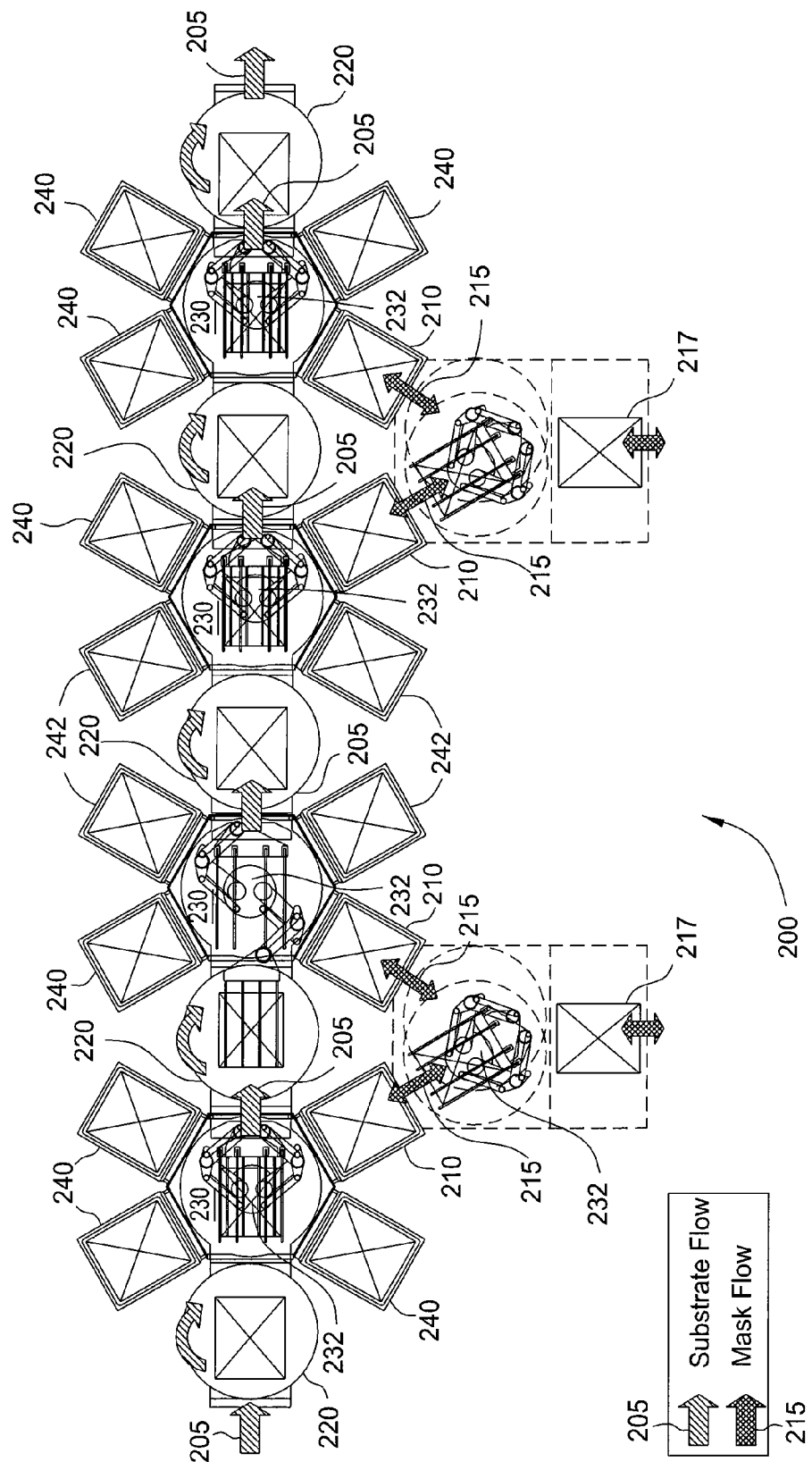
FIG. 2 illustrates a processing system 200 operable to perform a first process of encapsulating an OLED device.

FIG. 2 illustrates a processing system 200 operable to perform the process 100 of encapsulating an OLED device. Although the processing system 200 is described in conjunction with process 100, the processing system 200 is also capable of use with other processes. The processing system 200 includes four load lock chambers 210, five middle chambers 220, four transfer chambers 230, and twelve process chambers 240, 242. A transfer robot 232 is disposed in each transfer chamber 230.

Each transfer chamber 230 may be in communication with a load lock chamber 210 for rapid exchange of masks with the process chambers 240, 242 of each chamber cluster. In addition, each transfer chamber 230 is in communication with a middle chamber 220 for moving substrates and masks between the various chamber clusters of the processing system 200. The middle chambers 220 may also be used as a mask replacement chamber. The transfer chambers 230 are in communication with twelve process chambers 240, 242. One or more of the process chambers 240, 242 may be used to provide silicon nitride (SiNx), aluminum oxide ($Al_2O_3$), hexamethyldisiloxane (HMDSO), and/or other encapsulation layers and/or buffer layers on the OLED devices. In some embodiments, mask alignment and exchange may take place within the process chambers 240, 242.

A mask supply 217 may be in transferable communication with each load lock chamber 210 to introduce the substrates and/or masks into the chambers from an atmospheric environment. For example, the load lock chambers 210 may be used to transfer one or more masks in a mask cassette from an atmospheric environment into a vacuum environment. Reference arrows 205 represent the flow of the substrate(s) through the processing system 200. Reference arrows 215 represent the flow of the mask(s) through the processing system 200. Masks and substrates may be transferred between the chambers independent of each other as further described below.

During operation of the processing system 200, a substrate 110 is positioned in a first middle chamber 220. A cassette of one or more first masks 115 is transferred from a mask supply 217 to a first load lock chamber 210, for example, by a transfer robot 232. A transfer robot 232 disposed in a first transfer chamber 230 retrieves the substrate 110 from the first middle chamber 220, retrieves a first mask 115 from the first load lock chamber 210, and positions the substrate 110 and the first mask 115 in a process chamber 240 for depositing a first layer 140 on an OLED 130 disposed on the substrate 110. After deposition of the first layer 140, the substrate 110 and the first mask 115 are removed from the process chamber 240. The first mask 115 is removed from the substrate 110 and transferred into the first load lock chamber 210 for storage. The substrate 110 is then transferred to a second middle chamber 220. Optionally, each middle chamber 220 may be configured to rotate in order to position the masks and/or substrates close to the slit valve doors for ease of access by the transfer robot 232.

Next, a transfer robot 232 in the second transfer chamber 230 retrieves the substrate 110 from the second middle chamber 220. A second mask 125 is retrieved from a cassette of one or more second masks 125, which has been transferred from a mask supply 217 to a second load lock chamber 210. The transfer robot 232 positions the substrate 110 and the second mask 125 in a process chamber 242 for depositing a second layer 150 on the first layer 140 and the OLED 130. After deposition of the second layer 150, the substrate 110 and the second mask 125 are removed from the process chamber 242. The second mask 125 is removed from the substrate 110 and transferred into the second load lock chamber 210 for storage. The substrate 110 is then transferred to a third middle chamber 220.

A transfer robot 232 in the third transfer chamber 230 retrieves the substrate 110 from the third middle chamber 220. A third mask 135 is retrieved from a cassette of one or more third masks 135, which has been transferred from a mask supply 217 to a third load lock chamber 210. The transfer robot 232 positions the substrate 110 and the third mask 135 in a process chamber 240 for depositing a third layer 160 on the second layer 150, the first layer 140, and the OLED 130. After deposition of the third layer 160, the substrate 110 and the third mask 135 are removed from the process chamber 240. The third mask 135 is removed from the substrate 110 and transferred into the third load lock chamber 210 for storage. The substrate 110 is then transferred to a fourth middle chamber 220.

Once the substrate 110 reaches the fourth middle chamber 220, a transfer robot 232 in the fourth transfer chamber 230 may retrieve the substrate 110 and position the substrate 110 and a mask in a process chamber to deposit or pattern one or more additional layers (e.g., a fourth layer, a fifth layer, etc.). Alternatively, the substrate 110 may be retrieved from the fourth middle chamber 220 by the transfer robot 232 and transferred to a fifth middle chamber 220, where the substrate 110 may be removed from the processing system 200. In other embodiments, the second layer 150 may be deposited in a process chamber 242 coupled to the third transfer chamber 230, and the third layer 160 may be deposited in a process chamber 240 which is also coupled to the third transfer chamber 230, or the third layer 160 may be deposited in a process chamber 240 which is coupled to the fourth transfer chamber 230.

In yet other embodiments, multiple layers may be deposited or patterned onto the substrate 110 within a particular chamber cluster. That is, multiple layers may be deposited or patterned onto the substrate 110 in the process chambers 240, 242 coupled to a particular transfer chamber 230. For example, a first layer 140 may be deposited in a process chamber 240 coupled to the first transfer chamber 230, and second and third layers 150, 160 may be deposited and/or patterned in the process chambers 240, 242 coupled to the second transfer chamber 230. Optionally, in this embodiment, fourth and fifth layers may then be deposited and/or patterned in one or more process chambers 240, 242 coupled to the third and/or fourth transfer chambers 230, after which the substrate 110 may be transferred to the fifth middle chamber 220 and removed from the processing system 200. In addition, the load lock chamber 210 associated with each chamber cluster may store first masks 115, second masks 125, third masks 135, or multiple types of masks to enable access to the appropriate mask for a given deposition or patterning process.

A wide range of process chambers may be used with the processing system embodiments described herein. For example, the process chambers may be operable to perform plasma-enhanced chemical vapor deposition (PECVD), physical vapor deposition (PVD), or patterning of aluminum oxide, silicon nitride, HMDSO, and other similar encapsulation layers. In one embodiment, one or more process chambers 240, 242 may be a PECVD Process Chamber available from Applied Materials, Inc. of Santa Clara, Calif. The process chambers may be configured with a vision system comprising one or more cameras that are operable to provide a visual indication of the relative positions of and/or alignment between the mask and the substrate. The process chambers may be operable to move and rotate the masks in the X-Y-Z and theta directions.

Figure 3:
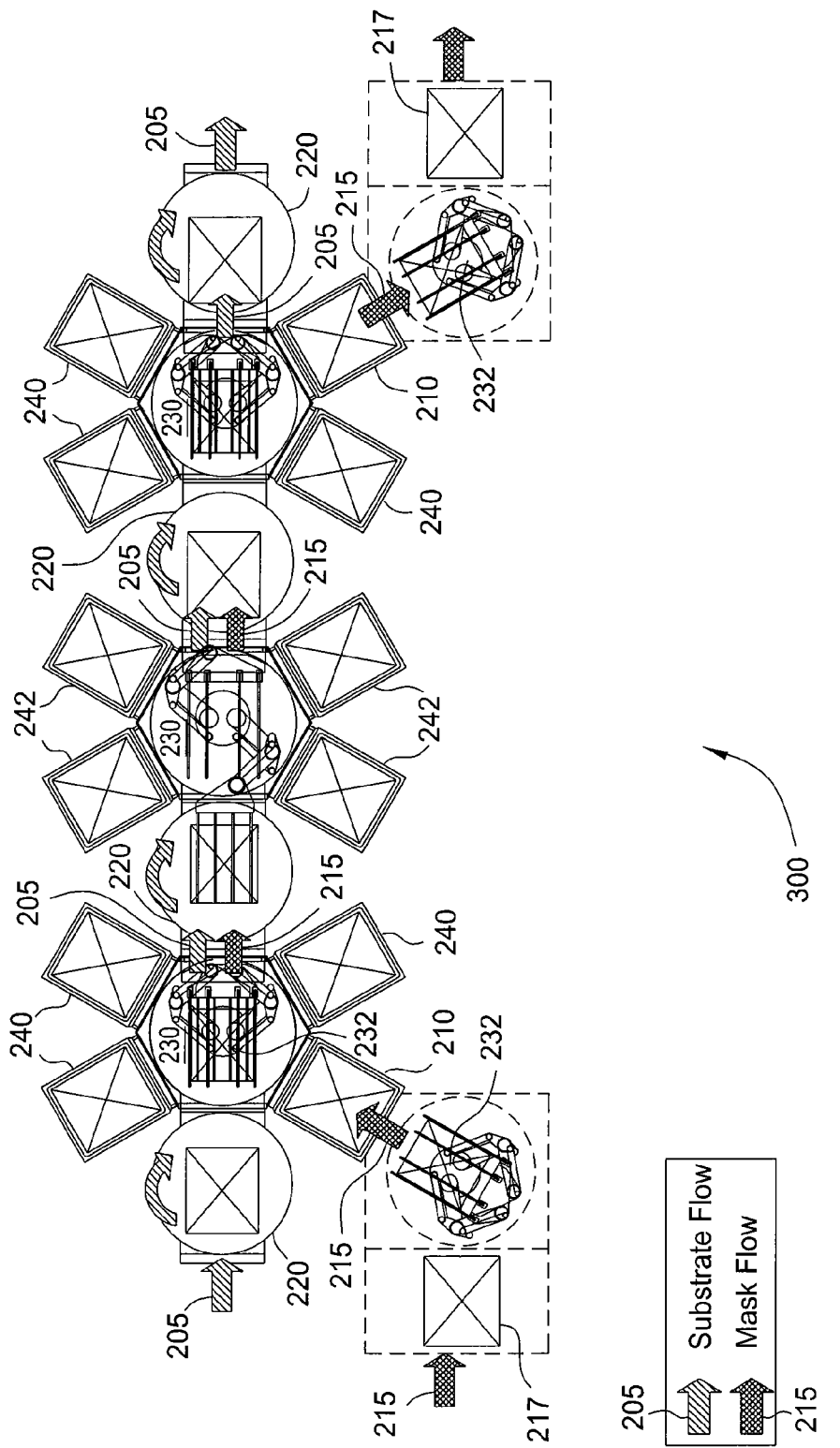
FIG. 3 illustrates a processing system 300 operable to perform a second process of encapsulating an OLED device.

FIG. 3 illustrates a processing system 300 operable to perform a process of encapsulating an OLED device. Although the processing system 300 is described in conjunction with a particular process, the processing system 300 is also capable of use with other processes, such as process 100. The processing system 300 includes two load lock chambers 210, four middle chambers 220, three transfer chambers 230, and ten process chambers 240, 242. A transfer robot 232 is disposed in each transfer chamber 230. A mask supply 217 may be in transferable communication with each load lock chamber 210. Reference arrows 205 represent the flow of the substrate(s) through the processing system 200. Reference arrows 215 represent the flow of the mask(s) through the processing system 200. The load lock chambers 210 are provided on opposite ends of the processing system 300, one for introducing masks and the other for removing masks from the system 300 without breaching the vacuum environment of the system 300.

During operation of the processing system 300, a substrate 110 is positioned in a first middle chamber 220, and a cassette of one or more first masks 115 is transferred from a mask supply 217 to a first load lock chamber 210. A transfer robot 232 disposed in a first transfer chamber 230 retrieves the substrate 110 from the first middle chamber 220, retrieves a first mask 115 from the first load lock chamber 210, and positions the substrate 110 and the first mask 115 in a process chamber 240 for depositing a first layer 140 on an OLED 130 disposed on the substrate 110. After deposition of the first layer 140, the substrate 110 and the first mask 115 are removed from the process chamber 240 and transferred to a second middle chamber 220. Optionally, each middle chamber 220 may be configured to rotate in order to position the masks and/or substrates close to the slit valve doors for ease of access by the transfer robot 232.

Next, a transfer robot 232 in the second transfer chamber 230 retrieves the substrate 110 and the first mask 115 from the second middle chamber 220 and positions the substrate 110 and the first mask 115 in a process chamber 242 for depositing and/or patterning a second layer 150 on the first layer 140 and the OLED 130. After deposition and/or patterning of the second layer 150, the substrate 110 and the first mask 115 are removed from the process chamber 242 and transferred to a third middle chamber 220. A transfer robot 232 in the third transfer chamber 230 retrieves the substrate 110 and the first mask 115 from the third middle chamber 220 and positions the substrate 110 and the first mask 115 in a process chamber 240 for depositing a third layer 160 on the second layer 150, the first layer 140, and the OLED 130. After deposition of the third layer 160, the substrate 110 and the first mask 115 are removed from the process chamber 240. The first mask 115 is removed from the substrate 110 and transferred into a second load lock chamber 210 for storage. The substrate 110 is then transferred to a fourth middle chamber 220 and removed from the processing system 300. It is also contemplated that multiple layers may be deposited or patterned onto the substrate 110 within a particular chamber cluster.

Although the processing system 300 of FIG. 3 has been described with respect to a particular process of encapsulating an OLED device, it also is contemplated that the processing system 300 may be used to perform other processes (e.g., process 100) of encapsulating an OLED device. For instance, instead of transferring the mask(s) between the middle chambers 220 and transfer chambers 230, one or more first masks 115 may remain in the first transfer chamber 230 for depositing a first layer 140, one or more second masks 125 may remain in the second transfer chamber 230 for depositing and/or patterning a second layer 150, and one or more third masks 135 may remain in the third transfer chamber 230 for depositing a third layer 160. Thus, instead of transferring both the substrate 110 and the masks 115, 125, 135 between chambers, only the substrate 110 is transferred, and the masks 115, 125, 135 remain within their respective chamber clusters.

Figure 4:
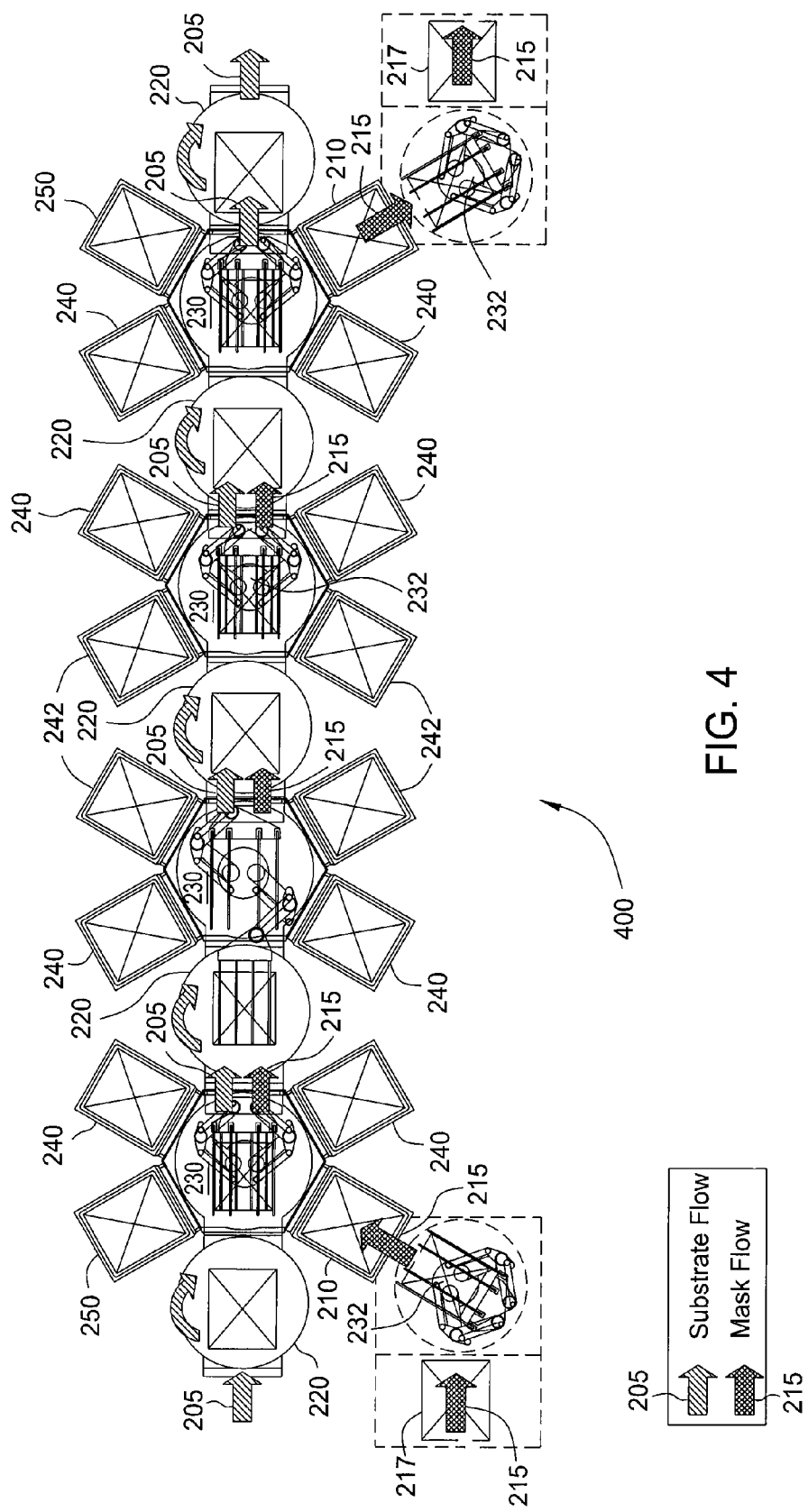
FIGS. 4 and 5 illustrate processing systems operable to encapsulate an OLED device.

FIG. 4 illustrates a processing system 400 operable to encapsulate an OLED device. The processing system 400 includes two load lock chambers 210, five middle chambers 220, four transfer chambers 230, and twelve process chambers 240, 242. Operation of the processing system 400 is similar to the operation of processing system 300 described above. However, processing system 400 further includes a mask chamber 250 at each end of the system. Once the masks have been introduced into the processing system 400, the transfer robot 232 in the first transfer chamber 230 may store one or more masks in the mask chamber 250. While in the mask chamber 250, the masks may held under vacuum conditions and may be heated up to and maintained at an appropriate temperature (e.g., about 80° C. to about 100° C.).

Figure 5:
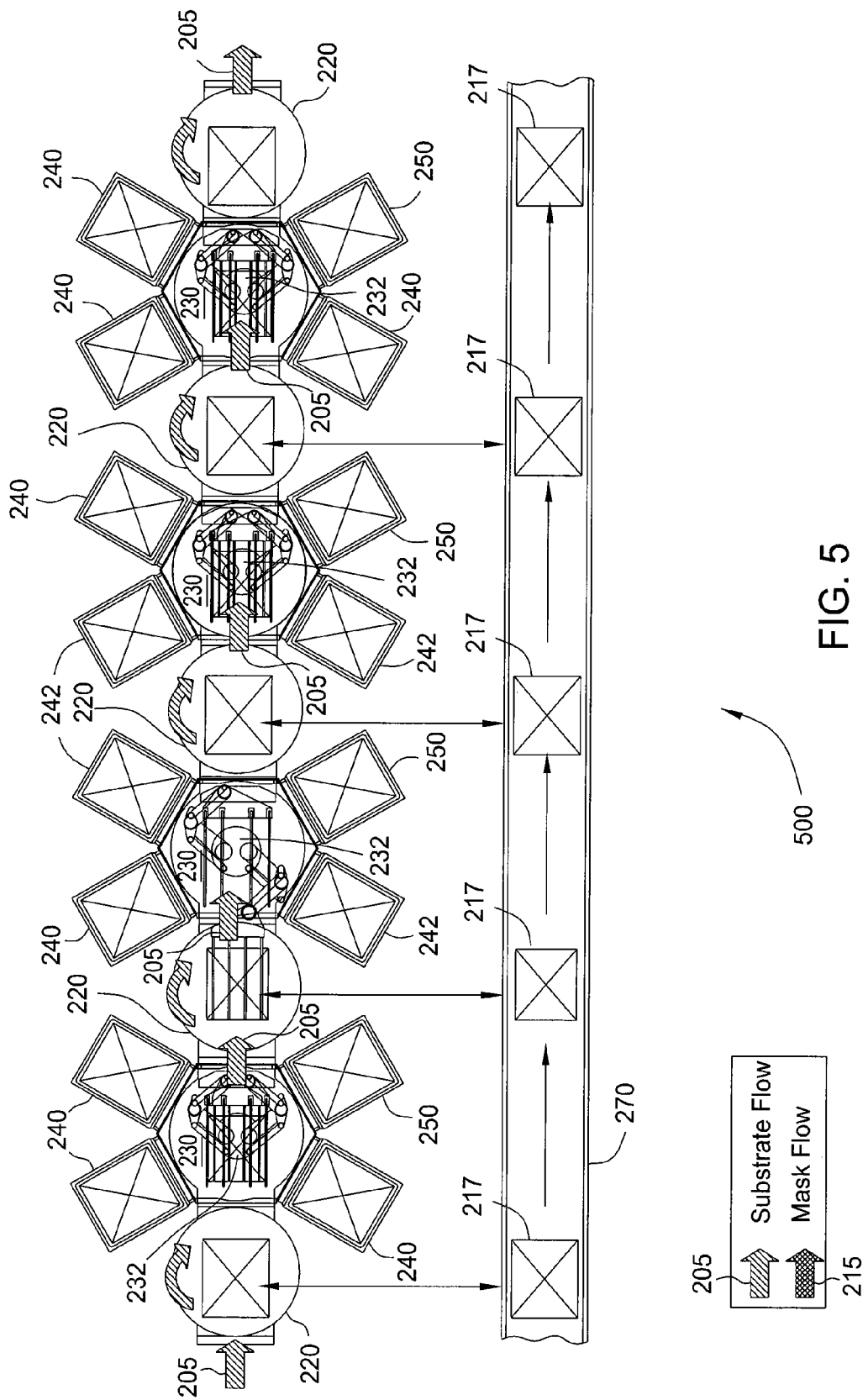

FIG. 5 illustrates a processing system 500 operable to encapsulate an OLED device. The processing system 500 includes five middle chambers 220, four transfer chambers 230, twelve process chambers 240, 242, and four mask chambers 250. Operation of the processing system 400 is similar to the operation of processing system 400 described above. However, processing system 500 has mask chambers 250 in communication with each transfer chamber 230 and does not include any load lock chambers 210. Instead, one or more mask supplies 217 are manually introduced into the middle chambers 220 via an overhead crane 270. In one embodiment, covers 222 (shown in FIG. 7) of the middle chambers 220 may be removed for manual exchange of the mask supply 217.

Figure 6:
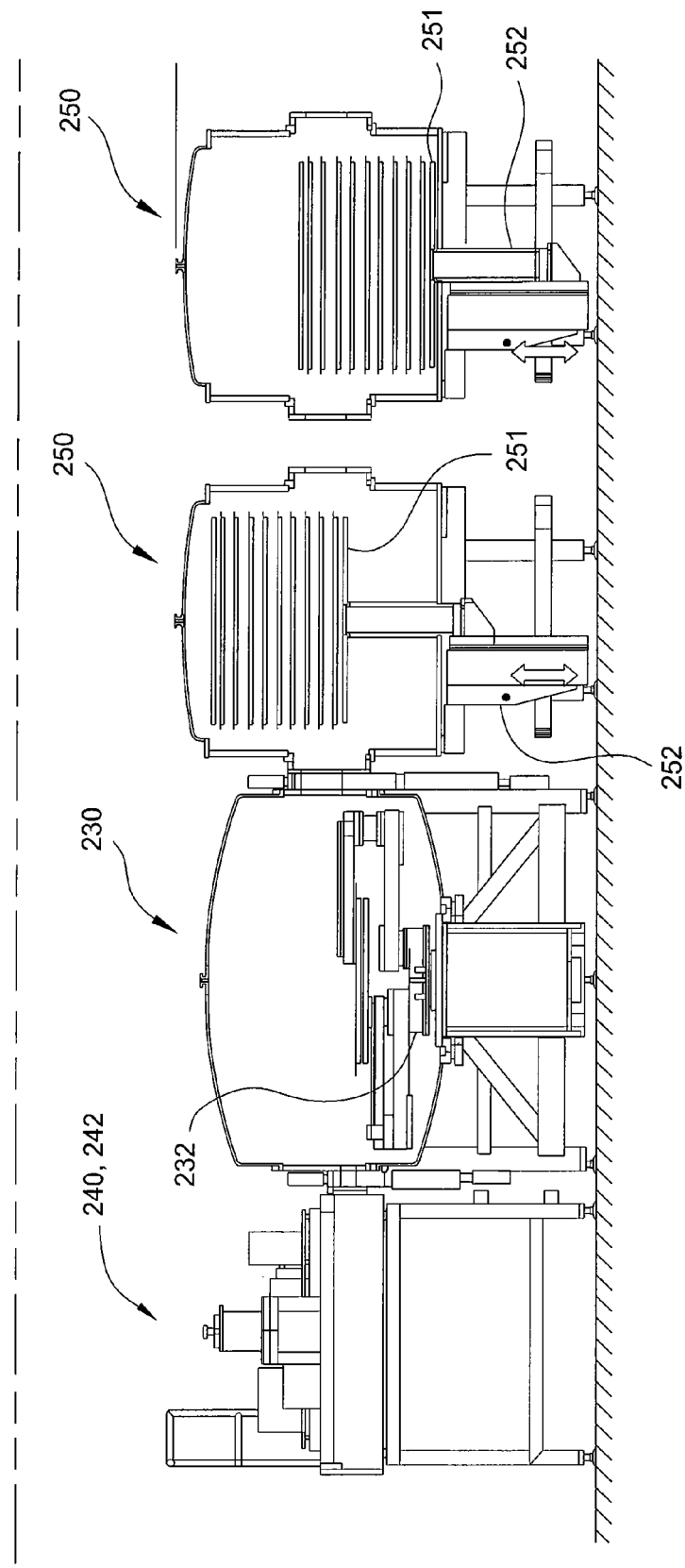
FIG. 6 illustrates a schematic cross-sectional view of a transfer chamber in transferable communication with a process chamber and a mask chamber.

FIG. 6 illustrates a schematic cross-sectional view of a transfer chamber 230 in transferable communication with a process chamber 240, 242 and a mask chamber 250. The process chamber 240, 242 may be operable to align masks on substrates and to encapsulate OLEDs with aluminum oxide, silicon nitride, HMDSO, or similar encapsulation layers using PVD or CVD processes. The transfer robot 232 of the transfer chamber 230 may include a dual arm design which is operable to introduce and retrieve masks and substrates to and from load lock chambers 210, middle chambers 220, process chambers 240, 242, and mask chambers 250. Each mask chamber 250 may store up to about 9-12 masks, may maintain a chamber temperature of about 20° C. to about 100° C., and/or may control the chamber pressure/purge for particle control. Each mask chamber 250 may also include a storage shelf 251 that is vertically movable via an actuator 252 to position the masks adjacent to the door of the mask chamber 250 for ease of access by the transfer robot 232 of the transfer chamber 230.

Figure 7:
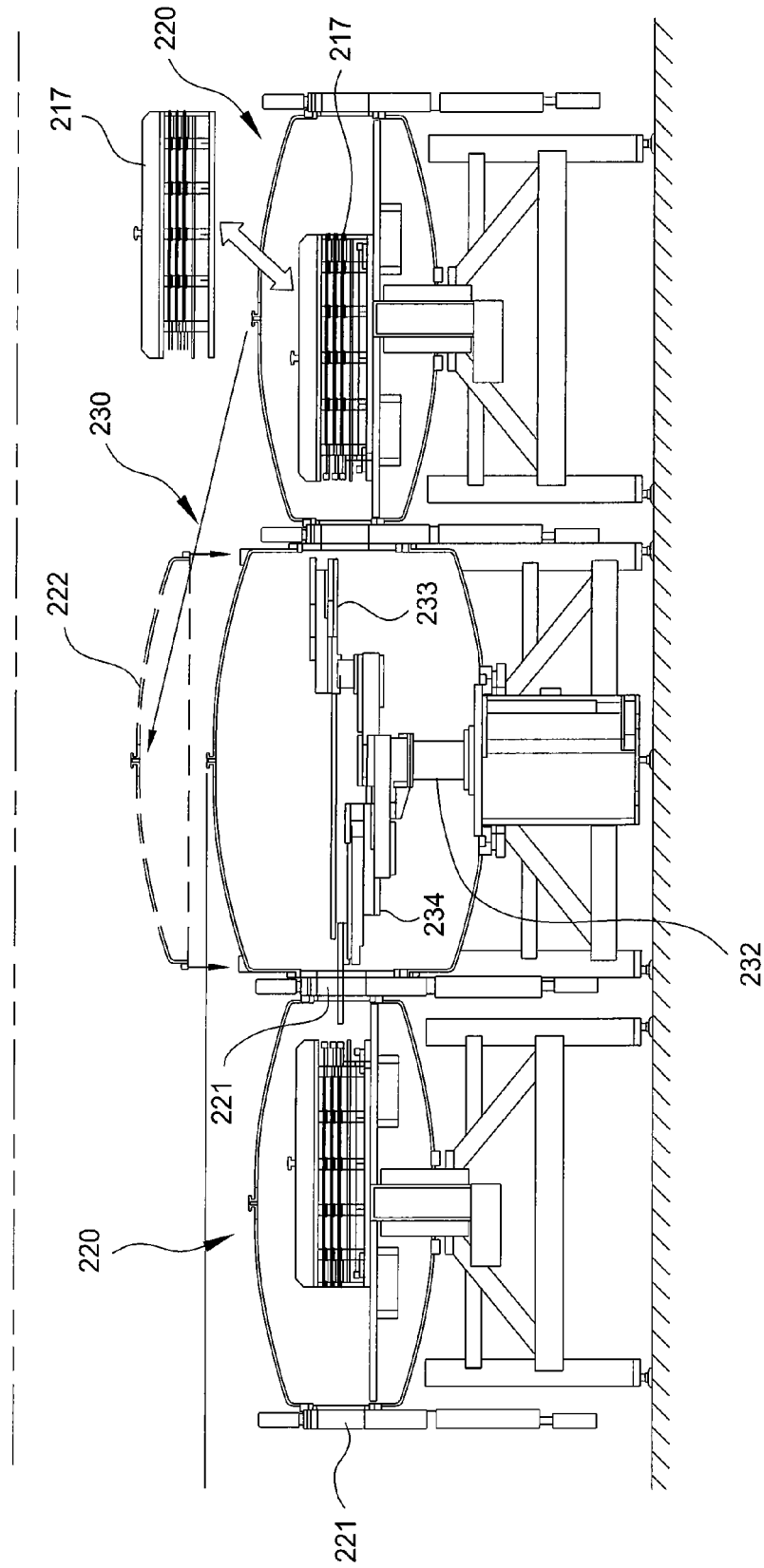
FIG. 7 illustrates a schematic cross-sectional view of a transfer chamber in transferable communication with two middle chambers.

FIG. 7 illustrates a schematic cross-sectional view of a transfer chamber 230 in transferable communication with two middle chambers 220. The middle chambers 220 may include one or more slit valve doors 221 through which substrates and masks may be transferred to and from the transfer chamber 230 and other chambers. The middle chambers 220 may also include a removable cover 222 for manually introducing a mask supply 217, such as a mask cassette, via an overhead crane, for example. Masks from the mask supply 217 may be moved to a mask chamber 250 for storage. The masks, substrates, and/or mask supply 217 may be positioned on a rotatable member of the middle chambers 220 that is operable to position the masks, substrates, and/or mask supply 217 near the slit valve doors 221 for ease of access by the transfer robot 232. The transfer robot 232 may include an upper arm 233 for handling substrates and a lower arm 234 for handling masks. The upper arm 233 and the lower arm 234 are rotatable about a central axis 229 of the transfer chamber 230 to move substrates and masks between the chambers.

Figure 8A:
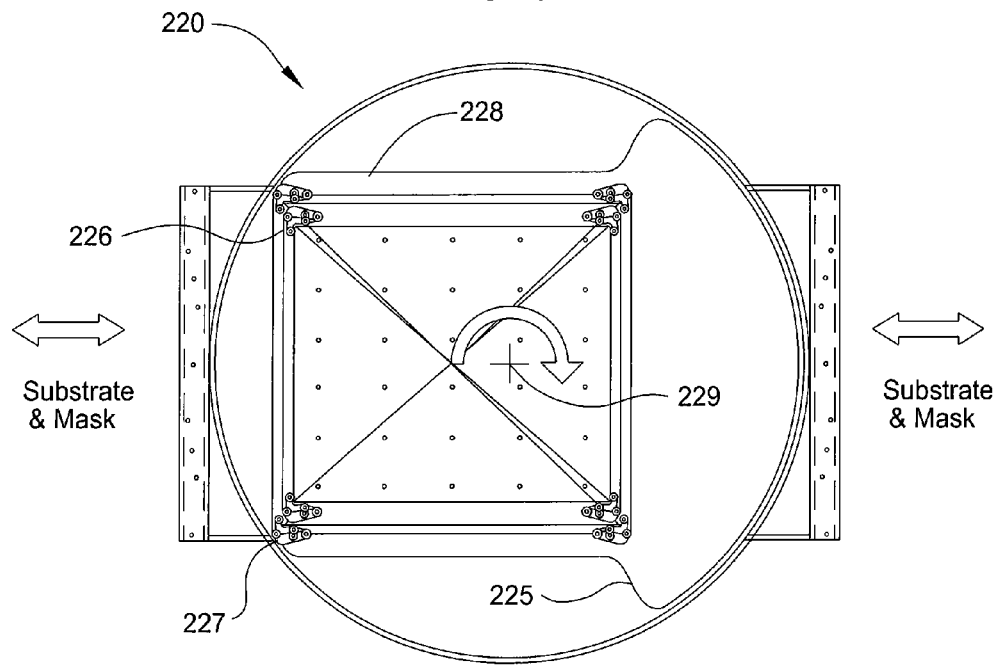
FIGS. 8A and 8B illustrate schematic top and side views of a middle chamber.
Figure 8B:
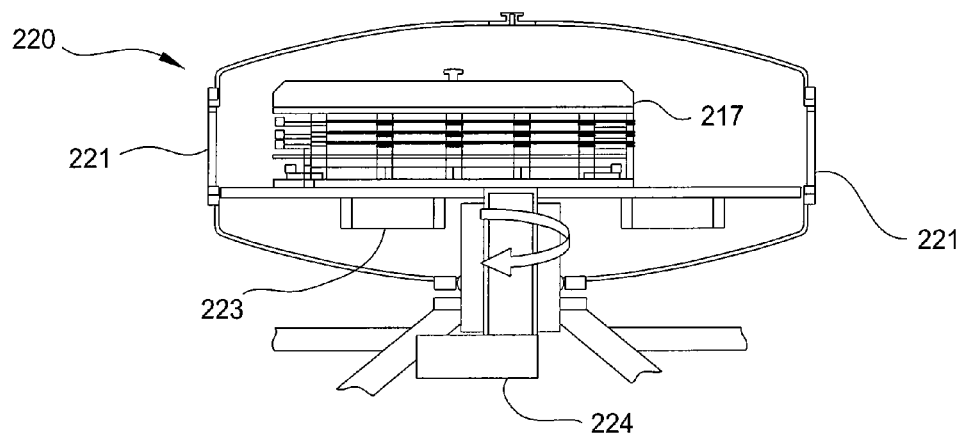

FIGS. 8A and 8B illustrate schematic top and side views of a middle chamber 220. The middle chamber 220 includes a substrate clamp 226 and a mask clamp 227 for supporting masks and substrates. The substrate clamp 226 and the mask clamp 227 may be operated via an actuator 223 to engage masks and substrates. Masks and substrates may be positioned on a support member 228 having a counterweight portion 225 that is rotatable via an actuator 224. The masks and/or substrates may be introduced through one of the slit valve doors 221 and positioned on the support member 228. The support member 228 may be rotated at least 180 degrees about a central axis 229 to position the masks and/or substrates closer to the other slit valve door 221. In this manner, the middle chambers 220 are operable to position masks and/or substrates relative to the transfer robot 232 of the transfer chambers 230 for ease of access between the chambers.

Figure 9B:
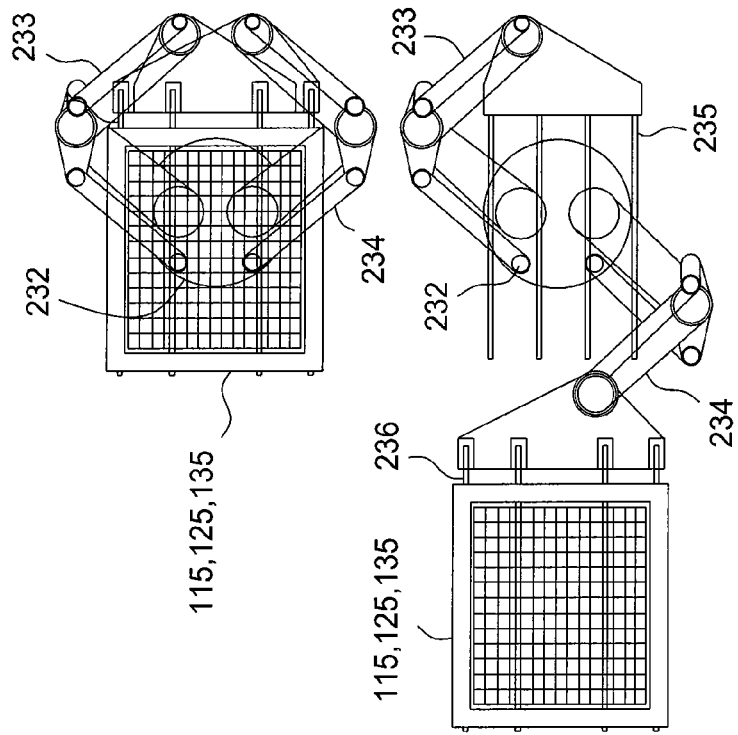
FIGS. 9A and 9B illustrate top views of upper and lower arms of a transfer robot.
Figure 9A:
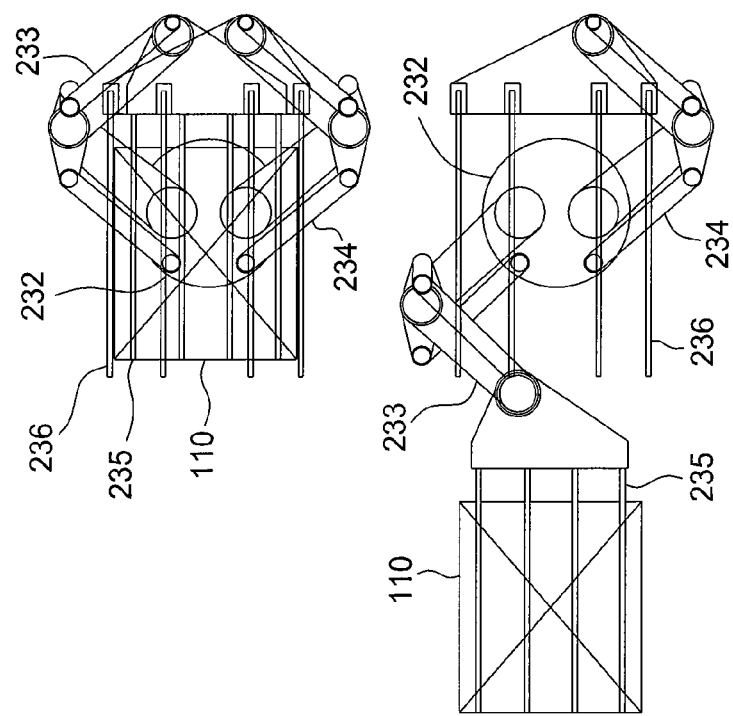

FIG. 9A illustrates a top view of the upper arm 233 of the transfer robot 232 of the transfer chamber 230. As depicted in FIG. 9A, the upper arm 233 is in extended and retracted positions supporting a substrate 110. The upper arm 233 includes an end effector 235 comprising one or more support members for supporting the substrate 110 from beneath. FIG. 9B illustrates a top view of the lower arm 234 of the transfer robot 232 of the transfer chamber 230. As depicted in FIG. 9B, the lower arm 234 is in extended and retracted positions supporting a mask. The lower arm 234 includes an end effector 236 comprising one or more support members for supporting the mask and for supporting the mask frame and/or outermost edge of the mask. The support members of the end effectors 235, 236 may be spaced to provide optimal support of the substrates and masks.

FIG. 10 is a schematic cross-sectional view of a CVD apparatus 1000 according to one embodiment. The apparatus 1000 includes a chamber body 1002 having an opening 1004 through one or more walls to permit one or more substrates 1006 and the mask 1008 to be inserted therein. The substrate 1006, during processing, is disposed on a substrate support 1010 opposite a diffuser 1012 having one or more openings 1014 therethrough to permit processing gas to enter the processing space 1016 between the diffuser 1012 and the substrate 1006.

For processing, the mask 1008 is initially inserted into the apparatus 1000 through the opening 1004 and disposed upon multiple motion alignment elements 1018. The substrate 1006 is then inserted though the opening 1004 and disposed upon multiple lift pins 1020 that extend through the substrate support 1010. The substrate support 1010 then raises to meet the substrate 1006 so that the substrate 1006 is disposed on the substrate support 1010. The substrate 1006 is aligned while on the substrate support 1010.

Once the substrate 1006 is aligned on the substrate support 1010, one or more visualization systems 1022 determine whether the mask 1008 is properly aligned over the substrate 1006. If the mask 1008 is not properly aligned, then one or more actuators 1024 move one or more motion alignment elements 1018 to adjust the location of the mask 1008. The one or more visualization systems 1022 then recheck the alignment of the mask 1008.

Once the mask 1008 is properly aligned over the substrate 1006, the mask 1008 is lowered onto the substrate 1006, and then the substrate support 1010 raises on the stem 1026 until the shadow frame 1028 contacts the mask 1008. The shadow frame 1028, prior to resting on the mask 1008, is disposed in the chamber body 1002 on a ledge 1030 that extends from one or more interior walls of the chamber body 1002. The substrate support 1010 continues to rise until the substrate 1006, mask 1008 and shadow frame 1028 are disposed in the processing position opposite the diffuser 1012. Processing gas is then delivered from one or more gas sources 1032 through an opening formed in the backing plate 1034 while a bias is provided to the diffuser.

In order to properly align the mask 1008 over the substrate 1006, the visualization system operates by illuminating a light through an opening 1202 formed through the substrate support 1010. The light shines through the substrate 1006 to see the location of the mask 1008. As will be discussed below, the substrate 1006 will have one or more alignment marks 1302 thereon that are centered in one or more openings 1204 formed in the mask 1008 when properly aligned. Thus, when viewing the alignment mark 1302 through the substrate support 1010, the one or more visualization systems 1022 will view the shadow frame 1028 as well as the boundary of the opening 1204 of the mask 1008. The shadow frame 1028 may be fabricated of anodized aluminum. However, because anodized aluminum has a grey color, the one or more visualization systems 1022 may have a difficult time viewing the alignment mark 1302 on a grey the shadow frame 1028. Therefore, the shadow frame 1028 may be modified to accommodate the visualization systems 1022.

Figure 11:
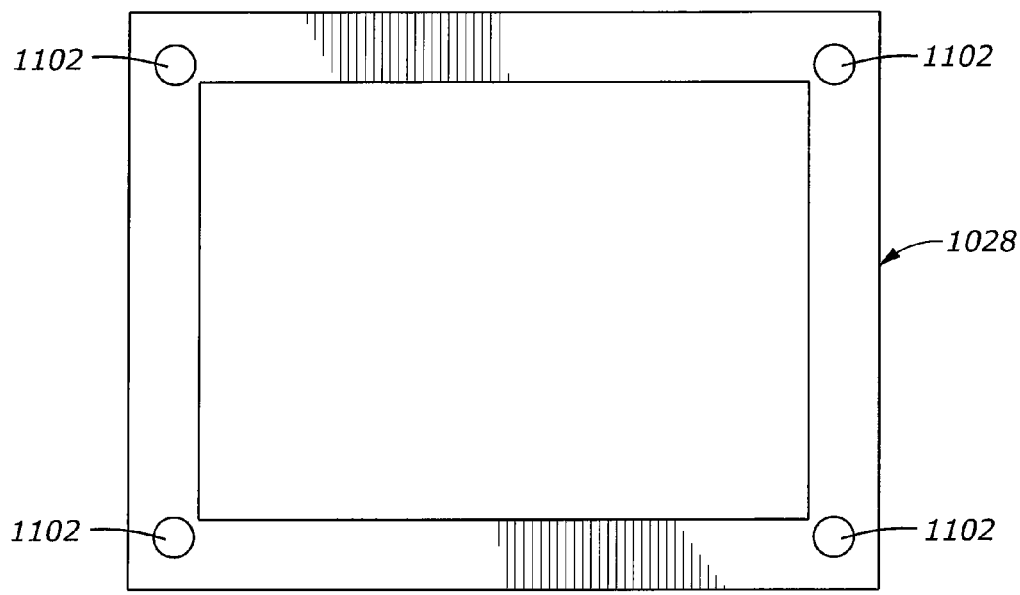
FIG. 11 is a bottom view of a shadow frame according to one embodiment.

FIG. 11 is a bottom view of the shadow frame 1028 according to one embodiment. To accommodate the visualization systems 1022, the shadow frame 1028 has a location 1102 corresponding to where the light from each visualization system 1022 will illuminate light. The locations 1102 are a portion of the shadow frame 1028 that is not anodized aluminum. The remainder of the shadow frame 1028 is anodized aluminum. It is to be understood that while four locations 1102 have been shown, more or less locations 1102 may be present. There is sufficient contrast between the mark on the substrate 1006 and the location 1102 on the shadow frame 1028 to ensure the visualization system 1022 can effectively visualize the mark on the substrate 1006. Additionally, there is sufficient contrast between the anodized portion of the shadow frame 1028 and the locations 1102 such that the visualization systems 1022 can distinguish between the portions of the shadow frame 1028. The locations 1102 may have bare, non-anodized aluminum, which would have a shiny-silver appearance rather than the grey of anodized aluminum. Alternatively, the locations 1102 may comprise a ceramic material inserted into the shadow frame 1028 such that the location 1102 has a white appearance for alignment purposes. The locations 1102 improve the contrast relative to the anodized shadow frame 1028 when the visualization system 1022 operates.

Figure 12:
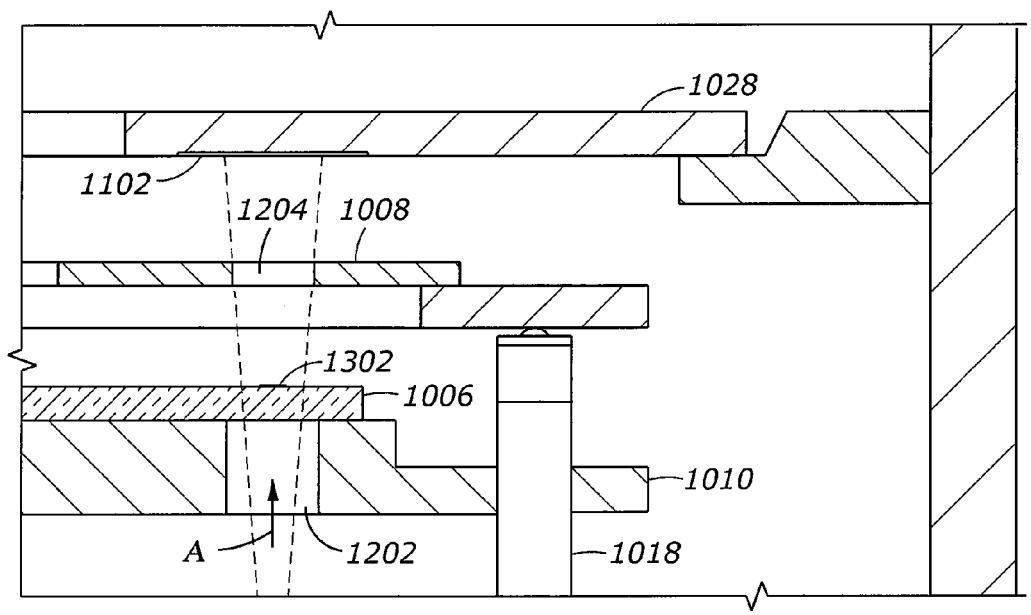
FIG. 12 is a schematic illustration showing an alignment element relative to a visualization system.

FIG. 12 is a schematic illustration showing an alignment element 1018 relative to an alignment visualization system measurement location. As shown in FIG. 12, the substrate support 1010 has openings therethrough not only for the lift pins 1020 (See FIG. 10), but also for the alignment elements 1018 to extend therethrough. Openings 1202 are also present at locations corresponding to where the alignment visualization systems 1022 will operate. It is to be understood that the alignment visualization systems 1022 may be disposed outside of the apparatus 1000 and utilize a visualization element, such as a camera, and an illumination element, such as a light source, to view into the apparatus 1000. The alignment visualization systems 1022 operate by illuminating a light in the direction shown by arrow "A" through the opening 1202 formed in the substrate support 1010, through the substrate 1006, through the opening 1204 formed in the mask 1008 and at the location 1102 on the shadow frame 1028. The alignment visualization systems 1022 then measure the distance that the alignment mark 1302 is from the boundary of the opening 1204 formed through the mask 1008.

Figure 13:
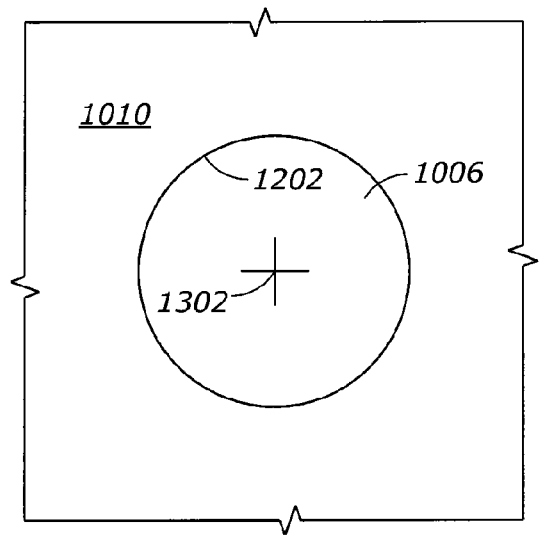
FIG. 13 is a bottom view through a substrate illustrating proper alignment of the mask over the substrate.

FIG. 13 is a bottom view through a substrate 1006 illustrating proper alignment of the mask 1008 over the substrate 1006. The substrate 1006 has an alignment mark 1302 thereon. Upon insertion within the chamber, the substrate 1006 is aligned on the substrate support 1010. Then, the mask 1008 is aligned. For proper alignment, an alignment mark 1302 is centered not only in the opening 1202 formed in the substrate support 1010 (which occurs prior to mask 1008 alignment), but also within the opening 1204 formed in the mask 1008. Once the mask 1008 is properly aligned over the substrate 1006, the alignment elements 1018 may lower the mask 1008 onto the substrate 1006.

Figure 14:
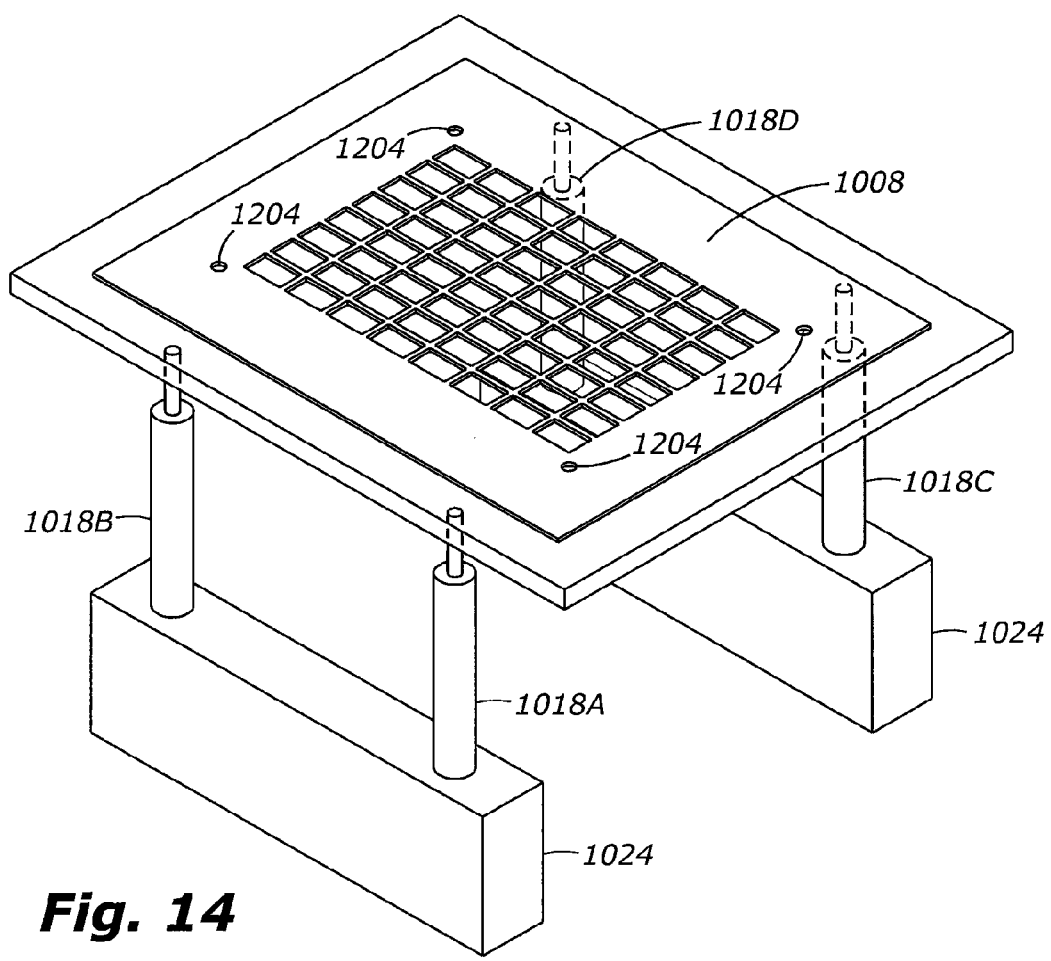
FIG. 14 is a schematic isometric view of a mask and alignment system according to one embodiment.

FIG. 14 is a schematic isometric view of a mask 1008 and alignment system according to one embodiment. As discussed above, the mask 1008 is initially inserted into the apparatus 1000 using an end effector that disposes the mask 1008 onto one or more alignment elements 1018. In the embodiment shown in FIG. 14, four alignment elements 1018A-1018D are present. It is to be understood that the invention is not limited to four alignment elements 1018A-1018D. Each alignment element 1018A-1018D is coupled to one or more actuators 1024 that control the movement of the alignment elements 1018A-1018D.

The alignment elements 1018A-1018D are not identical. Two alignment elements 1018A, 1018D are X-Y-Z alignment elements (i.e., movable via the actuator in three distinct planes) while the other two alignment elements 1018C, 1018D are Z motion alignment elements (i.e., movement via the actuator in only one plane). Thus, all four alignment elements 1018A-1018D are capable of movement in the plane perpendicular to the substrate 1006 deposition surface while only two alignment elements 1018A, 1018D are capable of movement within the plane parallel to the substrate 1006 deposition surface. In the embodiment shown in FIG. 14, the X-Y-Z alignment elements 1018A, 1018D are not adjacent each other, but rather, are opposite one another. Similarly, the Z alignment elements 1018B, 1018C are not adjacent each other, but rather, are opposite one another.

Figure 15:
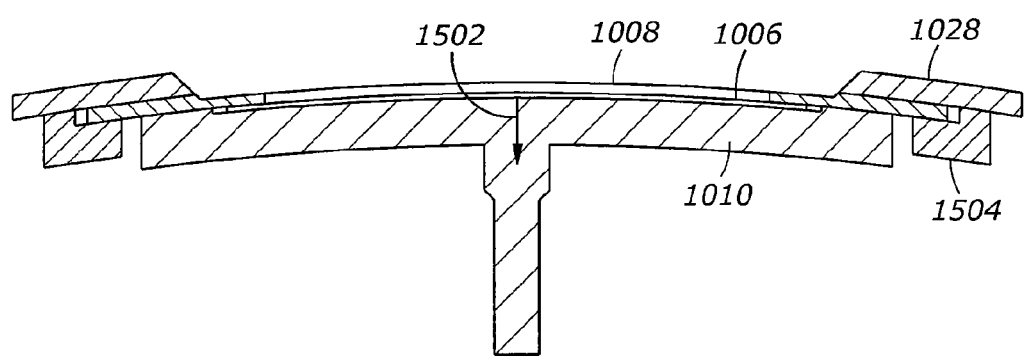
FIG. 15 is an exaggerated view of a mask positioned on a substrate.

FIG. 15 illustrates an exaggerated view of the mask 1008 positioned on the substrate 1006. The substrate support 1010 may include a convex surface 1502 on which the substrate 1006 and the mask 1008 are supported. When the substrate 1006 and the mask 1008 are lifted by the susceptor 1010, the weight of the shadow frame 1028 at the edges of the mask 1008 place the mask 1008 in tension across the convex surface 1502. The shadow frame 1028 may cover portions of the mask 1008 to prevent electrical arcing between the mask and other chamber components. The mask 1008 is placed in tension on top of the substrate 1006 to prevent movement or misalignment between the mask 1008 and the substrate 106 during handling or processing. The mask 1008 may include a mask support frame 1504 in one embodiment. The mask support frame 1504 may be a separate element from the mask 1008 or may comprise a part of the mask 1008 itself. Additionally, the mask 1008 may be electrically isolated from the susceptor 1010 in various embodiments.

By properly aligning the mask over the substrate utilizing two X-Y-Z motion alignment elements together with two Z motion alignment elements and one or more alignment visualization systems, a mask in a processing chamber can be aligned to within ±5 μm.

While the foregoing is directed to embodiments of the invention, other and further embodiments of the invention may be devised without departing from the basic scope thereof, and the scope thereof is determined by the claims that follow.

The invention claimed is:

1. A method of encapsulating an organic light-emitting diode (OLED) device, comprising:
    positioning a first mask over a substrate, the first mask having a first size;
    depositing a first encapsulating layer on an OLED device disposed on the substrate with the first mask, wherein the positioning the first mask over the substrate is performed in a first process chamber and the depositing the first encapsulating layer on an OLED device disposed on the substrate is performed in the first process chamber;
    positioning a second mask over the substrate, the second mask having a second size;
    depositing a buffer layer on the first encapsulating layer and the OLED device with the second mask;
    positioning a third mask over the substrate, the third mask having a size equal to the first size; and
    depositing a second encapsulating layer on the buffer layer, the first encapsulating layer, and the OLED device with the first mask.

2. The method of claim 1, wherein the first and second encapsulating layers comprise silicon nitride.

3. The method of claim 2, wherein the second size is different than the first size.

4. The method of claim 2, wherein the second size is the same as the first size.

5. The method of claim 1, wherein the second size is the same as the first size.

6. The method of claim 1, wherein the first mask and the third mask comprise substantially the same mask pattern.

7. The method of claim 1, further comprising:
    transferring the first mask into a first load lock chamber coupled to a first transfer chamber after the depositing the first encapsulating layer;
    transferring the second mask into a second load lock chamber coupled to a second transfer chamber after the depositing the buffer layer; and
    transferring the third mask into a third load lock chamber coupled to a third transfer chamber after the depositing the second encapsulating layer.

8. The method of claim 1, further comprising:
    receiving the substrate into a first middle chamber coupled between a first transfer chamber and second transfer chamber after depositing the first encapsulating layer; and
    receiving the substrate into a second middle chamber coupled between a second transfer chamber and a third transfer chamber after depositing the buffer layer.

9. The method of claim 8, further comprising:
    rotating a support member disposed in the first middle chamber to position the substrate closer to a transfer chamber.

10. The method of claim 1, further comprising:
    storing the first mask in a first mask chamber;
    heating the first mask in the first mask chamber; and
    receiving the first mask from the first mask chamber coupled to the first transfer chamber prior to positioning the first mask over the substrate in the first process chamber.

11. A method of encapsulating an organic light-emitting diode (OLED) device, comprising:
    receiving a substrate and a first mask into a first transfer chamber;
    positioning the first mask over the substrate, the first mask having a first size;
    depositing a first encapsulating layer on an OLED device disposed on the substrate with the first mask, wherein the positioning the first mask over the substrate is performed in a first process chamber and the depositing the first encapsulating layer on an OLED device disposed on the substrate is performed in the first process chamber;
    receiving the substrate and a second mask into a second transfer chamber;
    positioning the second mask over the substrate, the second mask having a second size;
    depositing a buffer layer on the first encapsulating layer and the OLED device with the second mask, wherein the positioning the second mask over the substrate is performed in a second process chamber and the depositing the buffer layer on the first encapsulating layer and the OLED device is performed in the second process chamber;
    receiving the substrate and a third mask into a third transfer chamber, the third mask having substantially the same mask pattern as the first mask;
    positioning the third mask over the substrate, the third mask having a size equal to the first size;
    depositing a second encapsulating layer on the buffer layer, the first encapsulating layer, and the OLED device with the first mask; wherein the positioning the third mask over the substrate is performed in a third process chamber, and the depositing the second encapsulating layer on the buffer layer, the first encapsulating layer, and the OLED device is performed in the third process chamber.

12. The method of claim 11, further comprising:
    transferring the first mask into a first load lock chamber coupled to the first transfer chamber after the depositing the first encapsulating layer;
    transferring the second mask into a second load lock chamber coupled to the second transfer chamber after the depositing the buffer layer; and
    transferring the third mask into a third load lock chamber coupled to the third transfer chamber after the depositing the second encapsulating layer.

13. The method of claim 11, further comprising:
    receiving the substrate into a first middle chamber coupled between the first transfer chamber and second transfer chamber after depositing the first encapsulating layer; and
    receiving the substrate into a second middle chamber coupled between the second transfer chamber and the third transfer chamber after depositing the buffer layer.

14. The method of claim 13, further comprising:
rotating a support member disposed in the first middle chamber to position the substrate closer to a transfer chamber.

15. The method of claim 11, further comprising:
storing the first mask in a first mask chamber;
heating the first mask in the first mask chamber.

16. The method of claim 15, further comprising:
receiving the first mask from the first mask chamber coupled to the first transfer chamber prior to positioning the first mask over the substrate in the first process chamber.

17. The method of claim 11, wherein the first and second encapsulating layers comprise silicon nitride.

18. The method of claim 17, wherein the second size is different than the first size.

19. The method of claim 17, wherein the second size is the same as the first size.

20. The method of claim 11, wherein the second size is the same as the first size.

* * * * *